United States Patent
Miyairi

(10) Patent No.: US 9,922,902 B2
(45) Date of Patent: Mar. 20, 2018

(54) SEMICONDUCTOR DEVICE AND SEMICONDUCTOR PACKAGE

(71) Applicant: SHINKO ELECTRIC INDUSTRIES CO., LTD., Nagano-shi, Nagano (JP)

(72) Inventor: Ken Miyairi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/600,010

(22) Filed: May 19, 2017

(65) Prior Publication Data
US 2017/0345736 A1  Nov. 30, 2017

(30) Foreign Application Priority Data
May 26, 2016 (JP) .................................. 2016-105602

(51) Int. Cl.
| | |
|---|---|
| H01L 23/00 | (2006.01) |
| H01L 23/42 | (2006.01) |
| H01L 23/31 | (2006.01) |
| H01L 23/367 | (2006.01) |
| H01L 23/373 | (2006.01) |
| H01L 23/522 | (2006.01) |

(52) U.S. Cl.
CPC .......... *H01L 23/42* (2013.01); *H01L 23/3107* (2013.01); *H01L 23/3672* (2013.01); *H01L 23/3736* (2013.01); *H01L 23/5226* (2013.01)

(58) Field of Classification Search
CPC ...................................................... H01L 23/42
See application file for complete search history.

(56) References Cited

U.S. PATENT DOCUMENTS

| | | | |
|---|---|---|---|
| 8,217,509 B2 | 7/2012 | Horiuchi et al. | |
| 9,048,242 B2 | 6/2015 | Horiuchi et al. | |
| 2009/0206470 A1 | 8/2009 | Horiuchi et al. | |
| 2011/0244631 A1 | 10/2011 | Horiuchi et al. | |
| 2013/0105964 A1* | 5/2013 | Seki .................... | H01L 23/4093 257/712 |
| 2013/0119529 A1* | 5/2013 | Lin ..................... | H01L 23/3675 257/704 |

FOREIGN PATENT DOCUMENTS

| | | |
|---|---|---|
| JP | 2007-165486 | 6/2007 |
| JP | 2009-194322 | 8/2009 |

\* cited by examiner

*Primary Examiner* — William Harriston
(74) *Attorney, Agent, or Firm* — Rankin, Hill & Clark LLP

(57) ABSTRACT

A semiconductor device includes: a semiconductor element; a heat radiator body having a housing recess wherein a bottom surface of the housing recess is thermally connected to the upper surface of the semiconductor element; a heat sink which is thermally connected to an upper surface of the heat radiator body through adhesive agent; a sealing resin which covers the lower surface and a side surface of the heat radiator body, an inner side surface of the housing recess, and the lower surface and a side surface of the semiconductor element; and a wiring structure body formed on a lower surface of the sealing resin. The sealing resin includes a covering portion having an upper surface which is substantially flush with the bottom surface of the housing recess and covering the side surface of the heat radiator body. The adhesive agent contacts the side surface of the heat radiator body.

5 Claims, 11 Drawing Sheets

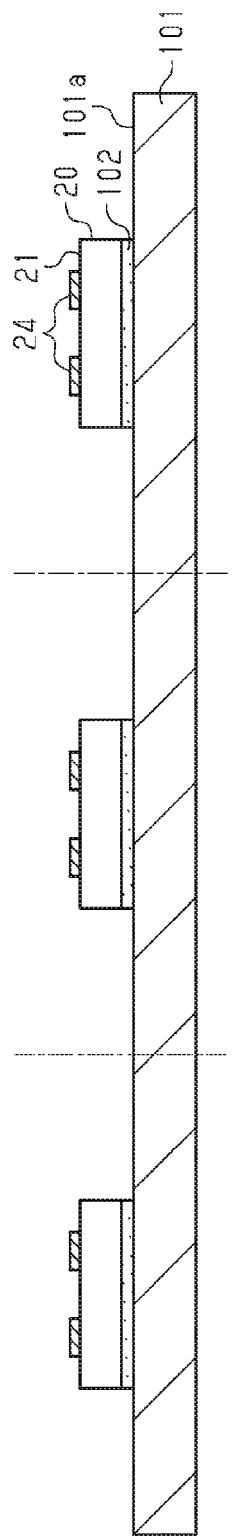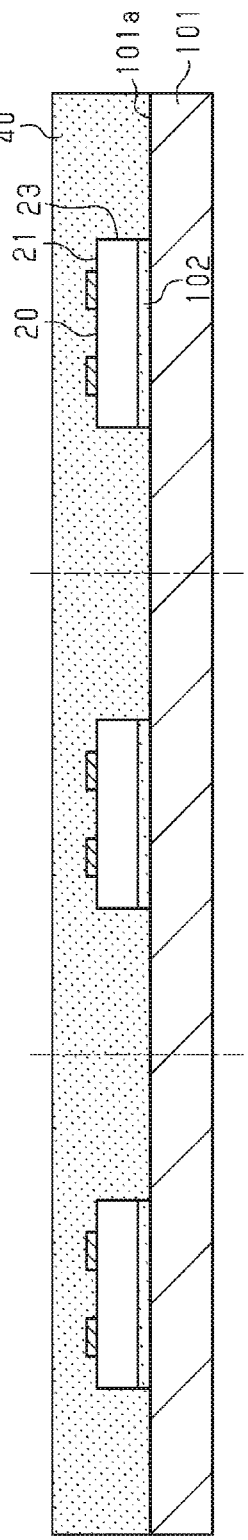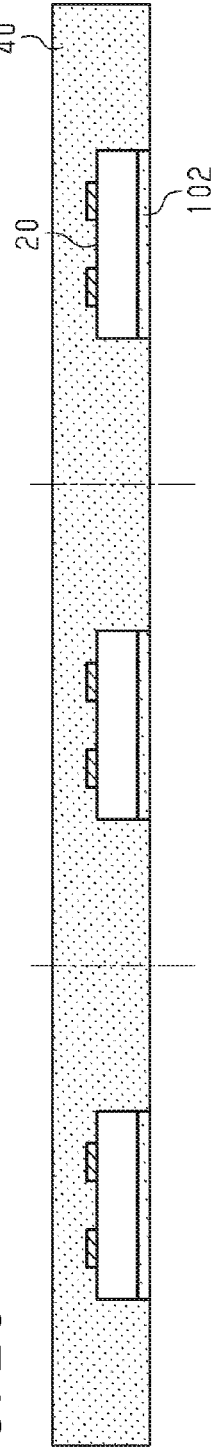

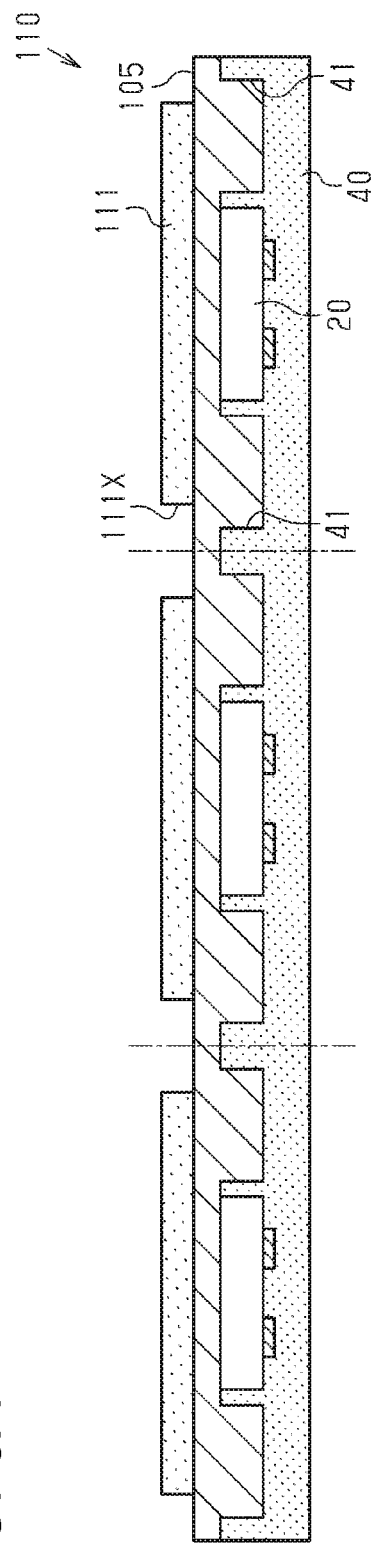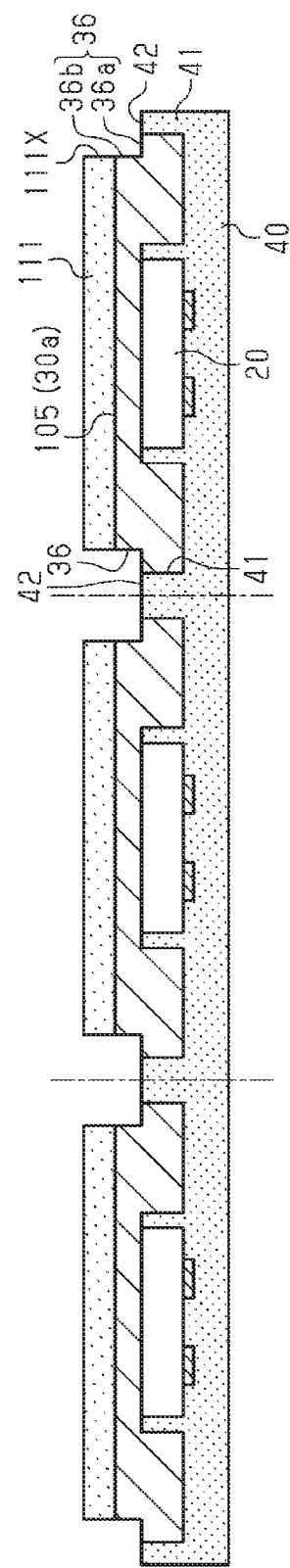
FIG. 8A
FIG. 8B

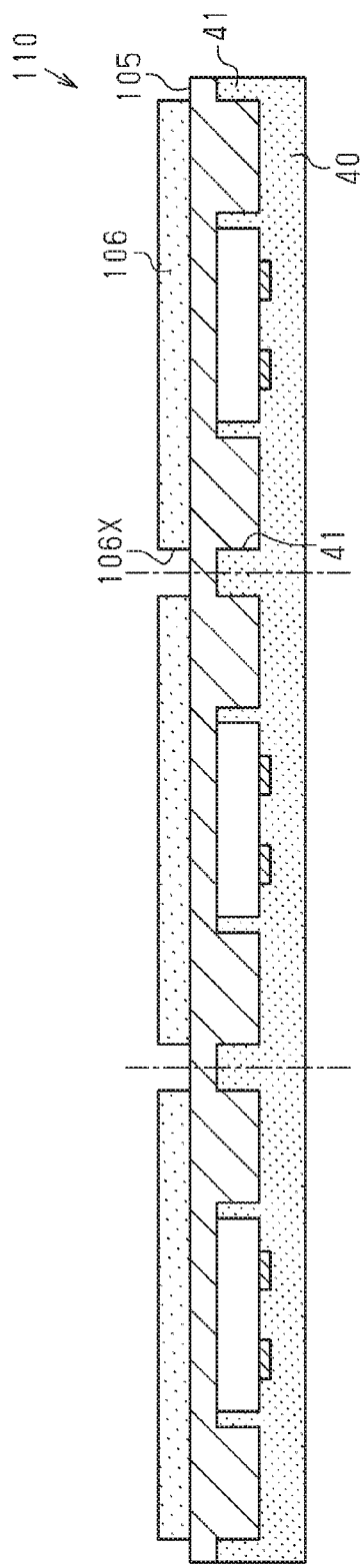
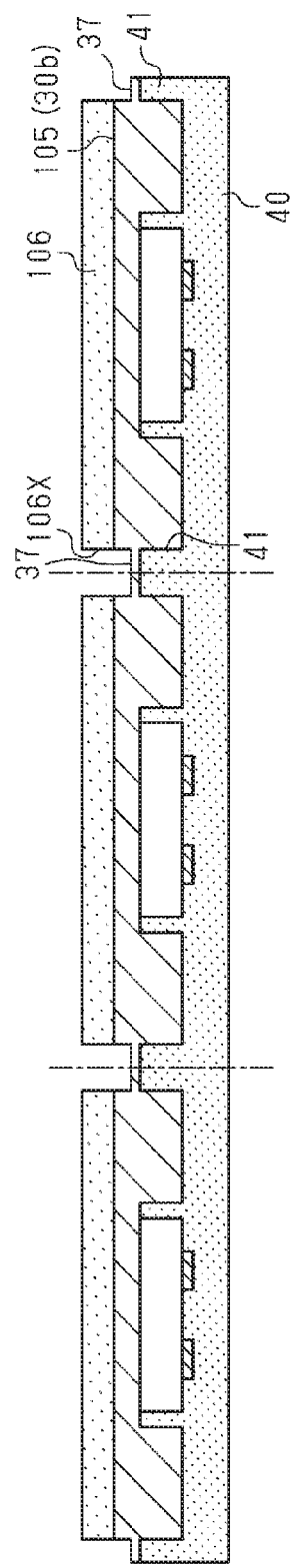
FIG. 10A
FIG. 10B

SEMICONDUCTOR DEVICE AND SEMICONDUCTOR PACKAGE

This application claims priority from Japanese Patent Application No. 2016-105602, filed on May 26, 2016, the entire contents of which are herein incorporated by reference.

BACKGROUND

1. Technical Field

The present disclosure relates to a semiconductor device and a semiconductor package.

2. Background Art

A semiconductor element used in a semiconductor device such as a central processing unit (CPU) generates heat due to operation of the semiconductor element. As performance and speed of the semiconductor element increase, an amount of the heat generated by the semiconductor element increases. When temperature of the semiconductor element rises in accordance with the increase of the amount of the generated heat, there are problems about lowering of operating speed, malfunction, etc. In order to avoid occurrence of such problems, various semiconductor devices each having a structure to radiate heat of a semiconductor element to the outside have been proposed. For example, there is a semiconductor device having a heat radiator plate which is thermally connected to a semiconductor element and whose upper surface is exposed (e.g. JP-A-2009-194322). Further, there is another semiconductor device which has heat radiator fins bonded to an upper surface of a heat radiator plate (e.g. see JP-A-2007-165486).

SUMMARY

According to one or more aspects of the present disclosure, there is provided a semiconductor device.

The semiconductor device comprises:
a semiconductor element having an upper surface, and a lower surface opposite to the upper surface and on which an electrode terminal is formed;
a heat radiator body having a housing recess which is formed in a lower surface of the heat radiator body and houses the semiconductor element, wherein a bottom surface of the housing recess is thermally connected to the upper surface of the semiconductor element;
a heat sink which is thermally connected to an upper surface of the heat radiator body through adhesive agent having a thermally conductivity;
a sealing resin which covers the lower surface and a side surface of the heat radiator body, an inner side surface of the housing recess, and the lower surface and a side surface of the semiconductor element; and
a wiring structure body which is formed on a lower surface of the sealing resin to be electrically connected to the semiconductor element.

The sealing resin comprises a covering portion having an upper surface which is substantially flush with the bottom surface of the housing recess and covering the side surface of the heat radiator body. The adhesive agent contacts the side surface of the heat radiator body.

According to one or more aspects of the present disclosure, there is provided a semiconductor package.

The semiconductor package comprises:
a semiconductor element having an upper surface, and a lower surface opposite to the upper surface and on which an electrode terminal is formed;
a heat radiator body having a housing recess which is formed in a lower surface of the heat radiator body and houses the semiconductor element, wherein a bottom surface of the housing recess is thermally connected to the upper surface of the semiconductor element;
a sealing resin which covers the lower surface and a side surface of the heat radiator body, an inner side surface of the housing recess, and the lower surface and a side surface of the semiconductor element; and
a wiring structure body which is formed on a lower surface of the sealing resin to be electrically connected to the semiconductor element.

The sealing resin comprises: a covering portion having an upper surface which is substantially flush with the bottom surface of the housing recess and covering the side surface of the heat radiator body.

BRIEF DESCRIPTION OF DRAWINGS

FIGS. 2A to 2C are schematic sectional views showing a method for manufacturing the semiconductor device;

FIGS. 8A and 8B are schematic sectional views showing a method for manufacturing the semiconductor device in FIG. 7;

FIGS. 10A and 10B are schematic sectional views showing a method for manufacturing the semiconductor device in FIG. 9.

DETAILED DESCRIPTION

An example of a semiconductor device according to an embodiment of the invention will be described below with reference to the drawings.

Incidentally, in some of the accompanying drawings, constituent elements may be shown in an enlarged mode in order to facilitate understanding. Dimension ratios etc. of the respective constituent elements may differ from practical ones or from ones depicted in the other drawings. In addition, some of the constituent elements may be not hatched in sectional view in order to facilitate understanding.

A semiconductor device 1 according to an embodiment will be described below with reference to FIGS. 1 to 6.

Figure 1:
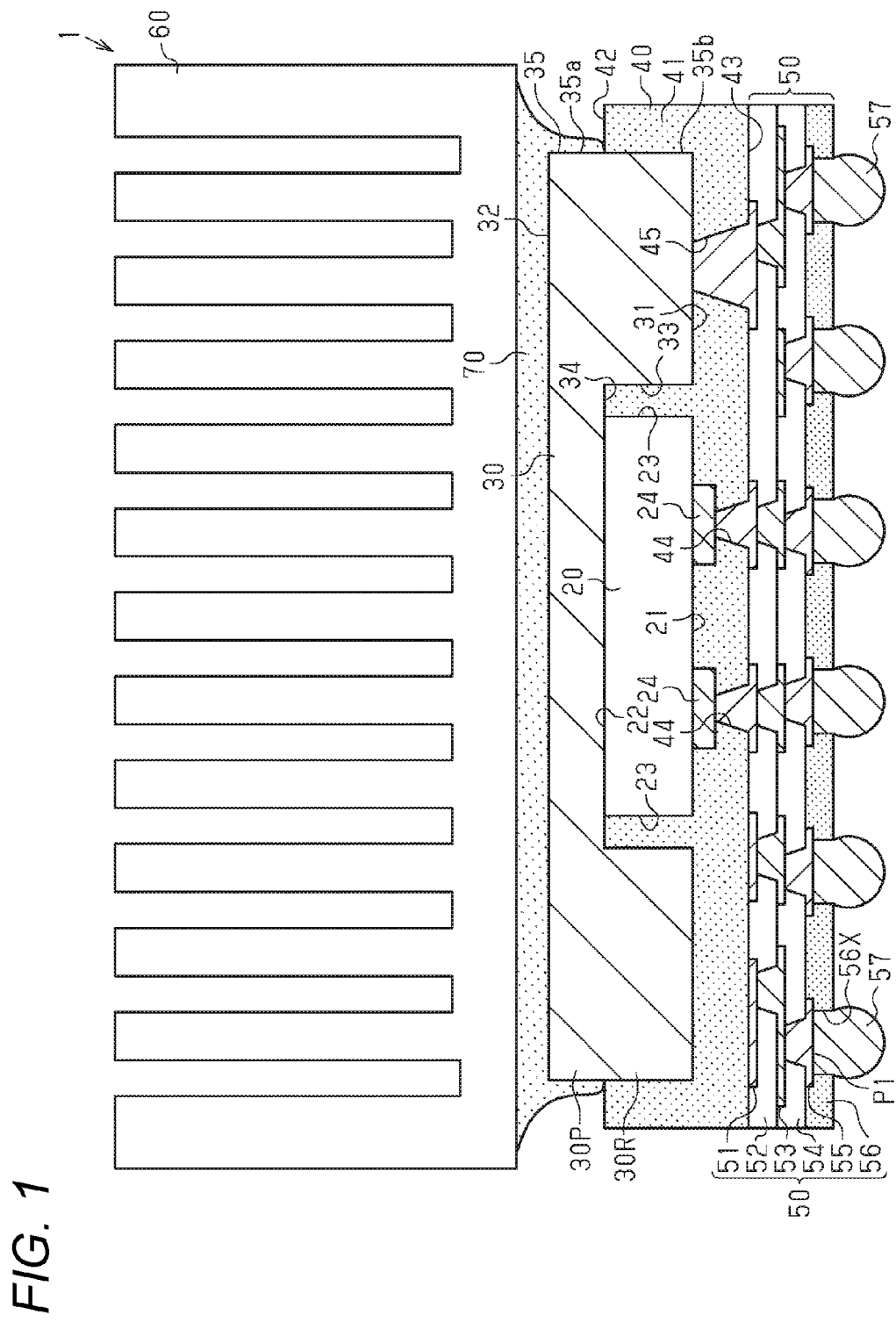
FIG. 1 is a schematic sectional view showing a semiconductor device according to an embodiment.

As shown in FIG. 1, the semiconductor device 1 has a semiconductor package 10, a heat sink 60, and an adhesive agent 70 through which the heat sink 60 is connected onto the semiconductor package 10.

The semiconductor package 10 has a semiconductor element 20 as an object from which heat should be released, a heat radiator body 30, a sealing resin 40, and a wiring structure body 50.

The semiconductor element 20 has an electrical function of the semiconductor package 10. The semiconductor element 20 is disposed in an internal portion (substantially the center) of the semiconductor package 10. For example, the semiconductor element 20 includes a thinned semiconductor substrate made of silicon (Si) etc. A semiconductor integrated circuit for providing the function is formed in the semiconductor element 20. In the embodiment, the semiconductor integrated circuit is formed in a lower surface 21 of the semiconductor element 20. The lower surface 21 may be also referred to as circuit formation surface, which may be designated by the same sign as the lower surface 21. An upper surface 22 of the semiconductor element 20 functions as a heat radiation surface from which heat mainly generated from the semiconductor element 20 is radiated. In addition, the upper surface 22 may be also referred to as back surface. Electrode terminals 24 for electrically connecting the semiconductor integrated circuit to the outside of the semiconductor element 20 are formed on the lower surface 21. For example, copper or a copper alloy can be used as the material of the electrode terminals 24.

For example, any of logic chips such as a central processing unit (CPU) chip and a graphics processing unit (GPU) chip can be used as the semiconductor element 20. In addition, for example, any of memory chips such as a dynamic random access memory (DRAM) chip, a static random access memory (SRAM) chip, and a flash memory chip can be also used as the semiconductor element 20.

The heat radiator body 30 is formed into a larger rectangular plate shape than that of the semiconductor element 20. The heat radiator body 30 has a housing recess 33 which is opened in a rectangular shape at the center of a lower surface 31 of the heat radiator body 30. The housing recess 33 is processed to be opened upward from the lower surface 31 in the heat radiator body 30. The semiconductor element 20 is housed in the housing recess 33. That is, dimensions of an upper surface 32 of the heat radiator body 30 are set to be larger than dimensions of the upper surface 22 of the semiconductor element 20. The upper surface 22 of the semiconductor element 20 is thermally connected to a bottom surface 34 of the housing recess 33. The heat radiator body 30 is formed to contact the upper surface 22 of the semiconductor element 20 and cover a side surface 23 of the semiconductor element 20. Accordingly, the heat radiator body 30 has a plate-like portion 30P and a rectangular ring-like portion 30R. The upper surface 22 of the semiconductor element 20 is connected to the plate-like portion 30P. The rectangular ring-like portion 30R is formed integrally with the plate-like portion and disposed around the semiconductor element 20.

As the material of the heat radiator body 30, a material excellent in thermal conductivity is preferred. For example, copper (Cu), silver (Ag), aluminum (Al) or any of alloys of these metals etc. can be used. The heat radiator body 30 has a function of dispersing density of the heat generated by the semiconductor element 20. Such a heat radiator body 30 is also called heat spreader.

The sealing resin 40 covers the circuit formation surface (lower surface) 21 and the side surface 23 of the semiconductor element 20. The sealing resin 40 is formed to cover a portion of the heat radiator body 30. To describe in detail, the housing recess 33 of the heat radiator body 30 is filled with the sealing resin 40. In addition, a space between the lower surface 31 of the heat radiator body 30 and an upper surface 51 of the wiring structure body 50 which will be described later is filled with the sealing resin 40. Further, the sealing resin 40 is formed to cover a side surface 35 of the heat radiator body 30 in a range from a lower end of the side surface 35 to at least the same height as that of the upper surface (heat radiation surface) 22 of the semiconductor element 20. Accordingly, the side surface 35 of the heat radiator body 30 has an upper side surface 35a and a lower side surface 35b. The upper side surface 35a is exposed from the sealing resin 40. The lower side surface 35b contacts the sealing resin 40 to be covered with the sealing resin 40.

In the sealing resin 40, a portion covering the side surface 35 of the heat radiator body 30 is regarded as a covering portion 41. The covering portion 41 is formed into a frame shape along the side surface 35 of the heat radiator body 30. An upper surface 42 of the covering portion 41 is flush with the upper surface 22 of the semiconductor element 20. The covering portion 41 is formed to extend from a lower surface of the sealing resin 40, i.e. the wiring structure body 50 up to at least the upper surface 22 of the semiconductor element 20. In the heat radiator body 30, the bottom surface 34 of the housing recess 33 is connected to the upper surface 22 of the semiconductor element 20. Accordingly, the bottom surface 34 of the housing recess 33 and the upper surface 22 of the semiconductor element 20 are flush with each other. Therefore, the upper surface 42 of the covering portion 41 of the sealing resin 40 is flush with the bottom surface 34 of the housing recess 33 of the heat radiator body 30. Incidentally, the upper surface 42 of the covering portion 41 does not have to be completely flush with the upper surface 22 of the semiconductor element 20 and the bottom surface 34 of the housing recess 33.

The lower surface 43 of the sealing resin 40 is a flat surface. For example, a thermosetting epoxy-based insulating resin can be used as the material of the sealing resin 40. Incidentally, the insulating resin is not limited to the thermosetting resin, but a photosensitive insulating resin can be used alternatively.

Via holes 44 are formed in the sealing resin 40 to penetrate the sealing resin 40 from the lower surface 43 and expose portions of lower surfaces of the electrode terminals 24 of the semiconductor element 20. In addition, a via hole 45 is formed in the sealing resin 40 to penetrate the sealing resin 40 from the lower surface 43 and expose a portion of the lower surface 31 of the heat radiator body 30.

The wiring structure body 50 is formed on the lower surface of the sealing resin 40. The wiring structure body 50 has a wiring layer 51, an insulating layer 52, a wiring layer 53, an insulating layer 54 and a wiring layer 55. The wiring layer 51, the insulating layer 52, the wiring layer 53, the insulating layer 54 and the wiring layer 55 are disposed on one another downward in the named sequence from the lower surface 43 of the sealing resin 40.

The wiring layer 51 has a wiring pattern which is formed on the lower surface of the sealing resin 40, and via wirings which are formed in the via holes 44 and 45 of the sealing resin 40 to be connected to the electrode terminals 24 and the heat radiator body 30. Incidentally, the via wiring connected to the heat radiator body 30 may be omitted. The insulating layer 52 is formed on the lower surface of the sealing resin 40 to cover the wiring layer 51. The wiring layer 53 is formed on a lower surface of the insulating layer 52. The wiring layer 53 has via wirings which penetrate the insulating layer 52 in a thickness direction, and a wiring pattern which is formed on the lower surface of the insulating layer 52 to be electrically connected to the wiring layer 51 through the via wirings of the wiring layer 53. The insulating layer 54 is formed on the lower surface of the insulating layer 52 to cover the wiring layer 53. The wiring layer 55 has via wirings which penetrate the insulating layer 54 in the thickness direction, and a wiring pattern which is formed on a lower surface of the insulating layer 54 to be electrically connected to the wiring layer 53 through the via wirings of the wiring layer 55.

For example, copper (Cu) or a copper alloy can be used as the material of the wiring layer 51, 53, 55. For example, an insulating resin such as an epoxy resin or a polyimide resin, or any of resin materials in which a filler made of silica, alumina etc. is mixed into these resins can be used as the material of the insulating layer 52, 54. In addition, for example, a reinforcing material-containing insulating resin in which a reinforcing material made of woven fabric or non-woven fabric etc. of glass, aramid or LCP (Liquid Crystal Polymer) fiber is impregnated with a thermosetting resin containing an epoxy resin, a polyimide resin etc. as a main component may be used as the material of the insulating layer 52, 54. Incidentally, a thermosetting insulating resin or a photosensitive insulating resin may be used as the material of the insulating layer 52, 54.

A solder resist layer 56 is formed on the lower surface of the insulating layer 54 to cover a portion of the wiring layer 55. Opening portions 56X are formed in the solder resist layer 56 so that portions of a lower surface of the wiring layer 55 can be exposed as external connection terminals P1 from the opening portions 56X.

For example, a photosensitive dry film resist or a liquid photoresist (e.g. a dry film resist or a liquid photoresist made of a novolac-based resin or an acrylic-based resin etc.) etc. can be used as the material of the solder resist layer 56. For example, assume that the photosensitive dry film resist is used. In this case, the dry film resist is laminated on the lower surface of the insulating layer 54 and the wiring layer 55 by thermocompression bonding, and the dry film resist is then patterned by a photolithographing method. In this manner, the solder resist layer 56 having the opening portions 56X can be formed. In addition, in the case where the liquid photoresist is used alternatively, the solder resist layer 56 can be also formed by similar steps.

Solder bumps 57 are formed on lower surfaces of the external connection terminals P1. The solder bumps 57 are external connection terminals which can be used for mounting the semiconductor device 1, i.e. the semiconductor package 10 on another board (e.g. a mount board such as a motherboard). Incidentally, solder balls, lead pins, stud bumps, etc. can be also used as the external connection terminals. In addition, the solder bumps 57 may be omitted.

The upper surface 32 of the aforementioned heat radiator body 30 serves as an upper surface of the semiconductor package 10. The heat sink 60 is connected to the upper surface 32 of the heat radiator body 30 through the adhesive agent 70. The heat sink 60 is so-called heat radiating fins each having a fin structure for dissipating heat into the atmosphere efficiently. Aluminum or an aluminum alloy can be used as the material of the heat sink 60. These materials are preferred because they are light in weight, can be processed easily and low in cost. In the embodiment, an area of a lower surface of the heat sink 60 is set to be larger than an area of the upper surface of the heat radiator body 30. Thus, heat is easily transferred to the heat sink 60 from the heat radiator body 30 and the heat is radiated into the atmosphere in the heat sink 60.

For example, a member having high thermal conductivity such as a thermal interface material (TIM) can be used as the adhesive agent 70. As the material of the TIM, for example, soft metal such as indium (In) or silver (Ag), silicone gel, or an organic resin binder etc. containing a metal filler, graphite, etc. can be used. Such an adhesive agent 70 can reduce thermal resistance between the heat radiator body 30 and the heat sink 60 while absorbing unevenness of front surfaces of the heat radiator body 30 and the heat sink 60. Thus, through the adhesive agent 70, thermal conduction can be performed from the heat radiator body 30 toward the heat sink 60 smoothly. The adhesive agent 70 has a function of bonding the heat radiator body 30 and the heat sink 60 to each other and a function of thermally connecting the heat radiator body 30 and the heat sink 60 to each other.

Next, a method for manufacturing the aforementioned semiconductor device will be described. Incidentally, in some drawings, only members required for explanation of the drawings appear with signs while members which will not be described appear with no signs.

In addition, for convenience of explanation, portions finally serving as constituent elements of the semiconductor device will be described with signs for the final constituent elements. As shown in FIG. 2A, each of semiconductor elements 20 in a facing-up state is arranged on an upper surface 101a of a plate-like support body 101 by an adhesive agent 102.

For example, a plate-like material high in rigidity, such as silicon, glass or metal (e.g. copper) can be used as the material of the support body 101.

For example, an epoxy-based adhesive agent can be used as the material of the adhesive agent 102. The adhesive agent 102 is applied, for example, to an upper surface 22 of the semiconductor element 20. The semiconductor element 20 is mounted on the upper surface of the support body 101. Thus, the semiconductor element 20 is bonded to the upper surface 101a of the support body 101. The semiconductor element 20 in the facing-up state in which a circuit formation surface 21 having electrode terminals 24 provided thereon faces upward is bonded to the upper surface 101a of the support body 101.

As shown in FIG. 2B, a sealing resin 40 is formed to cover the circuit formation surface 21 and a side surface 23 of the semiconductor element 20 and the upper surface 101a of the support body 101.

As shown in FIG. 2C, the support body 101 (see FIG. 2B) is removed.

Figure 3A:
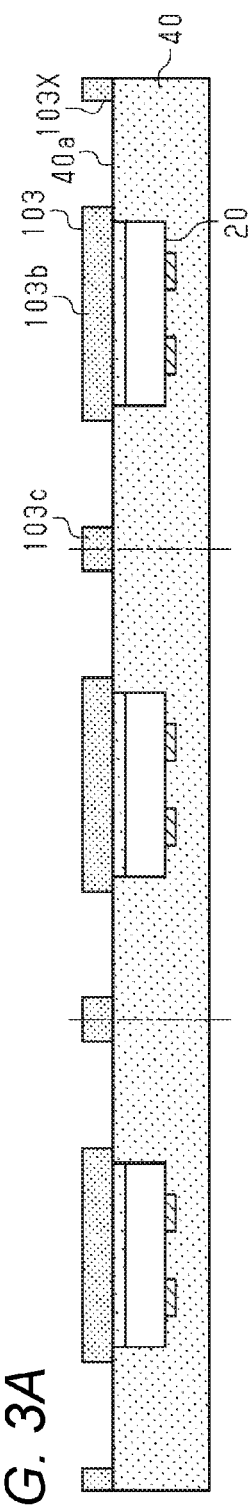
FIGS. 3A to 3D are schematic sectional views showing the method for manufacturing the semiconductor device.

As shown in FIG. 3A, a resist film 103 having an opening portion 103X in a predetermined position is formed on a surface 40a (an upper surface in FIG. 3A) of the sealing resin 40 on the upper surface 22 side of the semiconductor element 20. The opening portion 103X is formed in accordance with the shape of a heat radiator body 30 shown in FIG. 1. Incidentally, FIG. 3A is shown in a vertically inverted manner to FIG. 2C.

The resist film 103 has a portion 103b and a portion 103c. The portion 103b corresponds to the semiconductor element 20 and leaves the sealing resin 40 covering the side surface of the semiconductor element 20. The portion 103c corresponds to a covering portion 41 of the sealing resin 40 shown in FIG. 1. The portion 103b corresponding to the semiconductor element 20 is formed, for example, into a rectangular shape in plan view. The portion 103c corresponding to the covering portion 41 is formed into a latticed shape having a size (pitch) corresponding to a semiconductor package 10 shown in FIG. 1 in plan view.

As the material of the resist film 103, for example, a material etching-resistant to etching treatment in a next step can be used. For example, as the material of the resist film 103, a photosensitive dry film resist or a liquid photoresist (e.g. a dry film resist or a liquid photoresist made of a novolac-based resin or an acrylic-based resin etc.) etc. can be used.

Figure 3B:
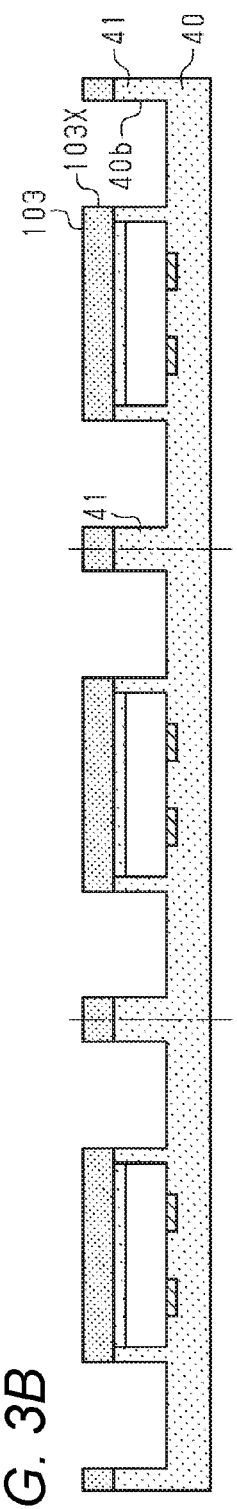

As shown in FIG. 3B, the sealing resin 40 is dry-etched with the resist film 103 as an etching mask. Thus, a recessed portion 40b is formed in the sealing resin 40. The recessed portion 40b is formed into a rectangular ring shape so as to surround the semiconductor element 20 embedded in the sealing resin 40.

Figure 3C:
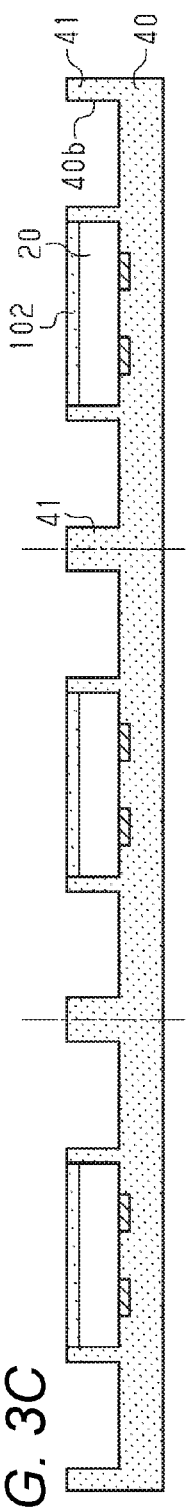
Figure 3D:
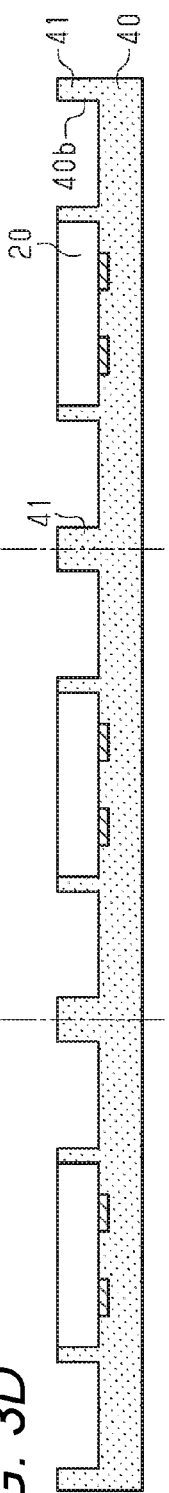

As shown in FIG. 3C, the resist film 103 (see FIG. 3B) is removed, for example, by an alkaline stripping agent. As shown in FIG. 3D, the adhesive agent 102 is removed, for example, by dry etching.

Figure 4A:
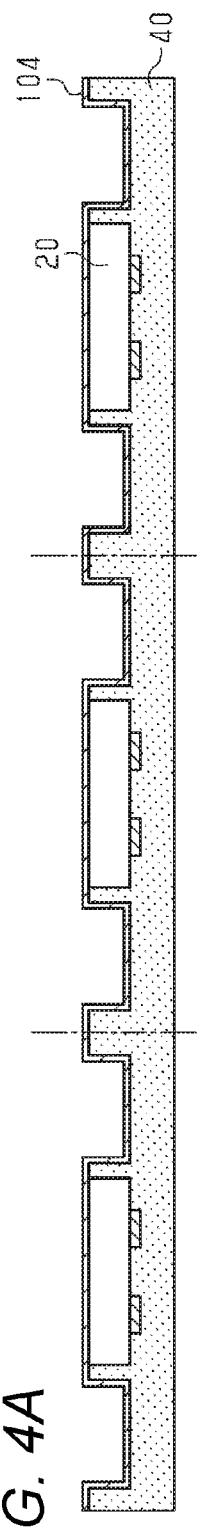
FIGS. 4A to 4D are schematic sectional views showing the method for manufacturing the semiconductor device.

As shown in FIG. 4A, a seed layer 104 continuously covering a front surface of the sealing resin 40 and the upper surface 22 of the semiconductor element 20 is formed. As the material of the seed layer 104, for example, copper or a copper alloy can be used. The seed layer 104 can be formed, for example, by a sputtering method or an electroless plating method.

Figure 4B:
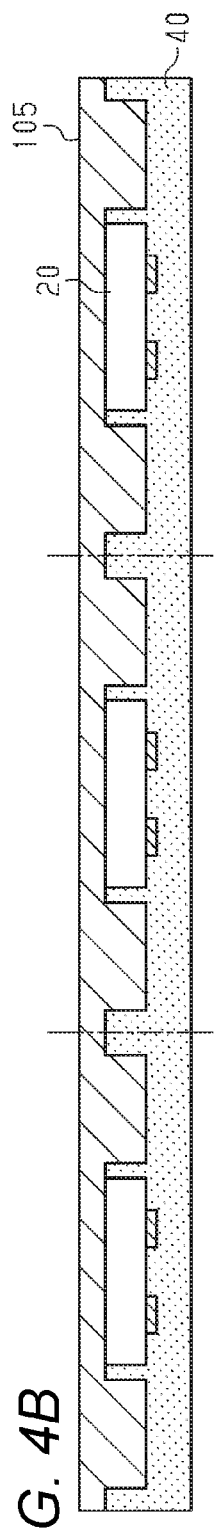

As shown in FIG. 4B, an electrolytic plating method (e.g. an electrolytic copper plating method) using the seed layer 104 (see FIG. 4A) as a plating power feeding layer is performed to form a plating layer 105.

Figure 4C:
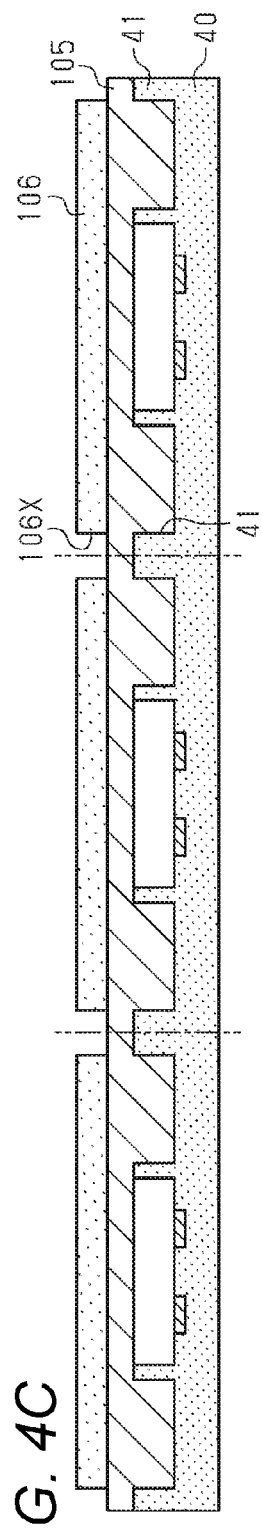

As shown in FIG. 4C, a resist film 106 having an opening portion 106X is formed on an upper surface of the plating layer 105. The opening portion 106X is formed in accordance with the covering portion 41 of the sealing resin 40 shown in FIG. 1. For example, the opening portion 106X is formed into a latticed shape having a size (pitch) corresponding to the semiconductor package 10 shown in FIG. 1 in plan view.

As the material of the resist film 106, for example, a material etching-resistant to etching treatment in a next step can be used. For example, as the material of the resist film 106, a photosensitive dry film resist or a liquid photoresist (e.g. a dry film resist or a liquid photoresist made of a novolac-based resin or an acrylic-based resin etc.) etc. can be used. For example, the dry film resist is patterned by a photolithographing method so that the resist film 106 having the aforementioned opening portion 106X can be formed.

Figure 4D:
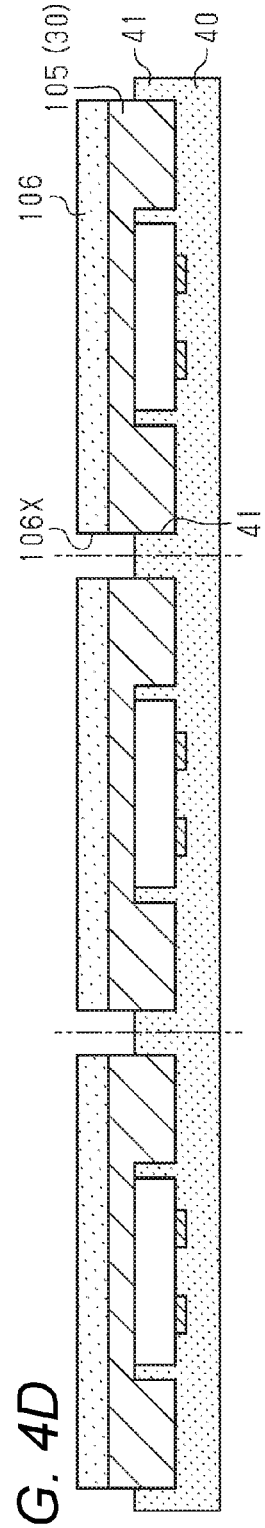

As shown in FIG. 4D, the plating layer 105 is etched, for example, by dry etching, with the resist film 106 as an etching mask, to thereby expose the sealing resin 40 from the opening portion 106X. Incidentally, the plating layer 105 may be etched by wet etching. By the etching treatment, the plating layer 105 is formed into the separated heat radiator body 30. In the following description, the heat radiator body 30 will be used. The resist film 106 is removed, for example, by an alkaline stripping agent.

Figures 5A, 5B, 5C, 5D:
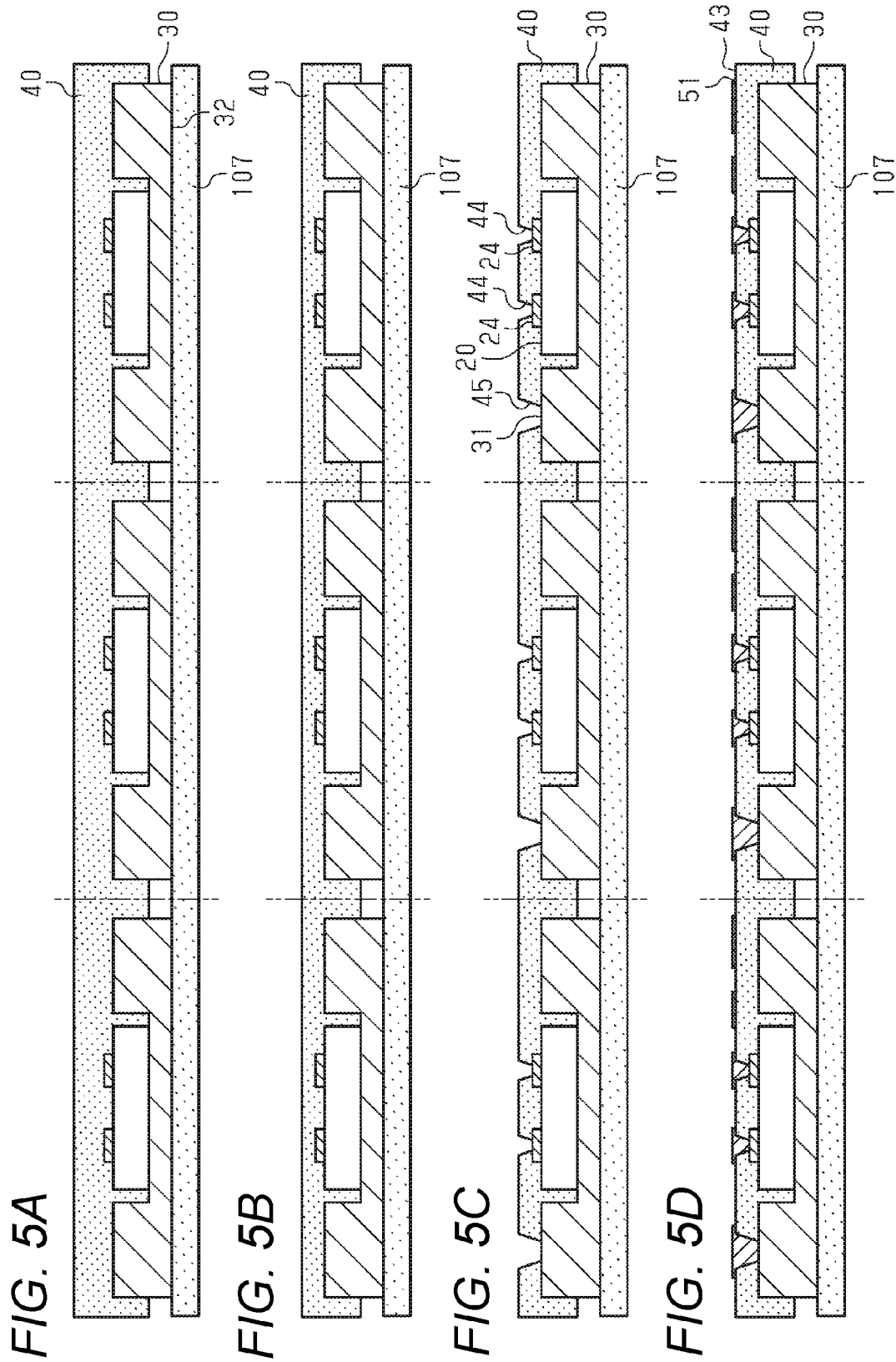
FIGS. 5A to 5D are schematic sectional views showing the method for manufacturing the semiconductor device.

As shown in FIG. 5A, a protective layer 107 covering an upper surface 32 of the heat radiator body 30 is formed. Incidentally, FIG. 5A is shown in a vertically inverted manner to FIG. 4C. As the material of the protective layer 107, for example, a material resistant to plating treatment or etching treatment as will be described later can be used. For example, as the material of the protective layer 107, a photosensitive dry film resist (e.g. a dry film resist made of a novolac-based resin or an acrylic-based resin etc.) etc. can be used. The dry film resist may be laminated on the upper surface 32 of the heat radiator body 30 by thermocompression bonding to form the protective layer 107.

As shown in FIG. 5B, the sealing resin 40 is thinned. As the thinning treatment, for example, grinding or dry etching can be used. As shown in FIG. 5C, via holes 44 are formed at predetermined places of the sealing resin 40 so that portions of lower surfaces of electrode terminals 24 of the semiconductor element 20 can be exposed from the via holes 44. Similarly, a via hole 45 is formed at a predetermined place of the sealing resin 40 so that a portion of a lower surface 31 of the heat radiator body 30 can be exposed from the via hole 45. The via holes 44 and 45 can be formed, for example, by a laser machining method using a $CO_2$ laser, a UV-YAG laser, etc. Incidentally, desmear treatment is performed to remove a residue (resin smears) if occasions demand. In addition, when the sealing resin 40 is formed out of a photosensitive resin, for example, the necessary via holes 44 and 45 may be formed, for example, by a photolithographing method.

A wiring structure body 50 shown in FIG. 1 is formed. The wiring structure body 50 is formed, for example, by a buildup method. First, as shown in FIG. 5D, a wiring layer 51 including via wirings and a wiring pattern is formed. The via wirings are formed as via conductors with which the via holes 44 and 45 of the sealing resin 44 are filled. The wiring pattern is electrically connected to the electrode terminals 24 and the heat radiator body 30 through the via wirings. The wiring layer 51 can be formed, for example, by various wiring forming methods such as a semi-additive method and a subtractive method.

Figure 6A:
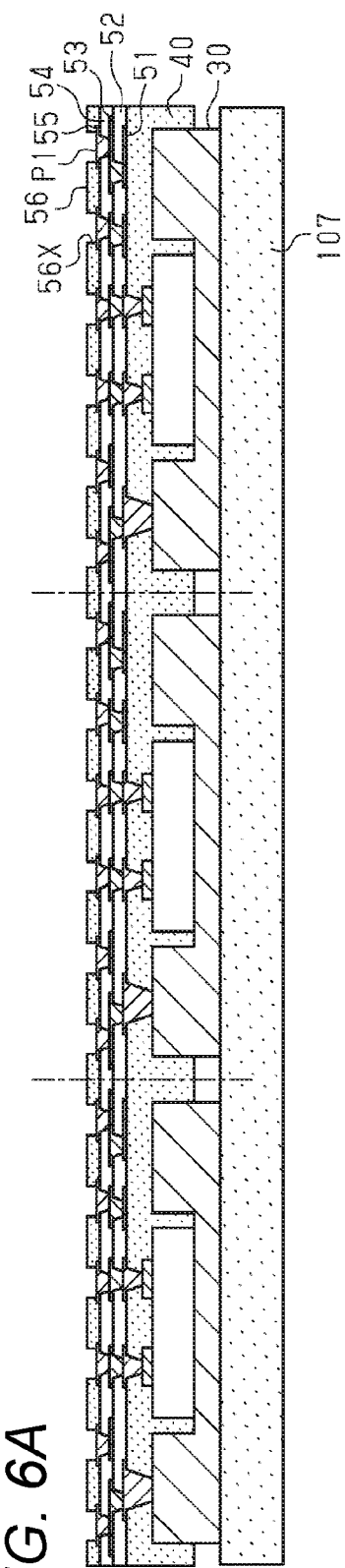
FIGS. 6A to 6C are schematic sectional views showing the method for manufacturing the semiconductor device.

Next, as shown in FIG. 6A, an insulating layer 52, a wiring layer 53, an insulating layer 54, a wiring layer 55, and a solder resist layer 56 are formed. For example, a resin film is laminated on the sealing resin 40 in a vacuum, and the resin film is heated and hardened to form the insulating layer 52. Incidentally, the insulating layer 52 may be formed by applying and heating a paste-like or liquid resin. Successively, opening portions are formed in the insulating layer 52, and desmear treatment is performed if occasions demand. Then, the wiring layer 53 is formed, for example, by a semi-additive method. The insulating layer 54 and the wiring layer 55 are formed in a similar manner.

Next, a solder resist layer 56 having opening portions 56X is formed on a lower surface of the insulating layer 54. For example, the solder resist layer 56 can be obtained in such a manner that a photosensitive solder resist film is laminated or a liquid solder resist is applied, and the resist is exposed to light and developed by a photolithographing method to be patterned into a necessary shape.

Figure 6B:
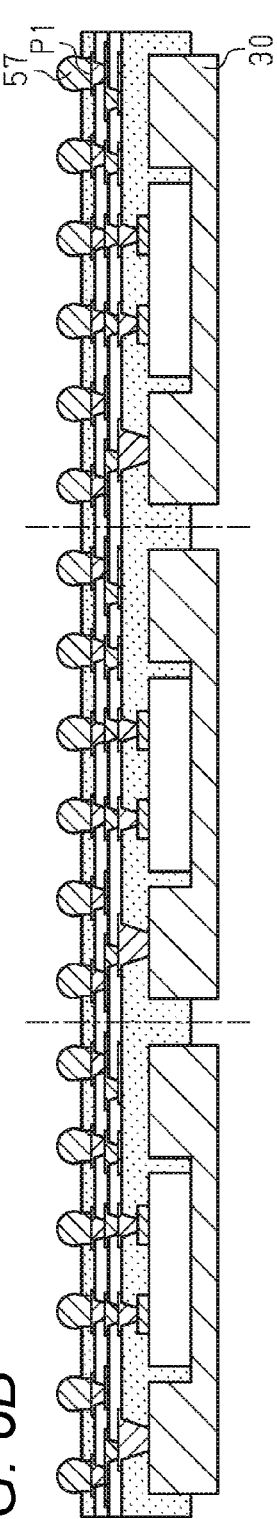

As shown in FIG. 6B, solder bumps 57 connected to external connection terminals P1 are formed. For example, solder balls or a solder paste arranged on the external connection terminals P1 is subjected to reflow treatment to form the solder bumps 57. Then, the protective layer 107 (see FIG. 6A) is removed.

Figure 6C:
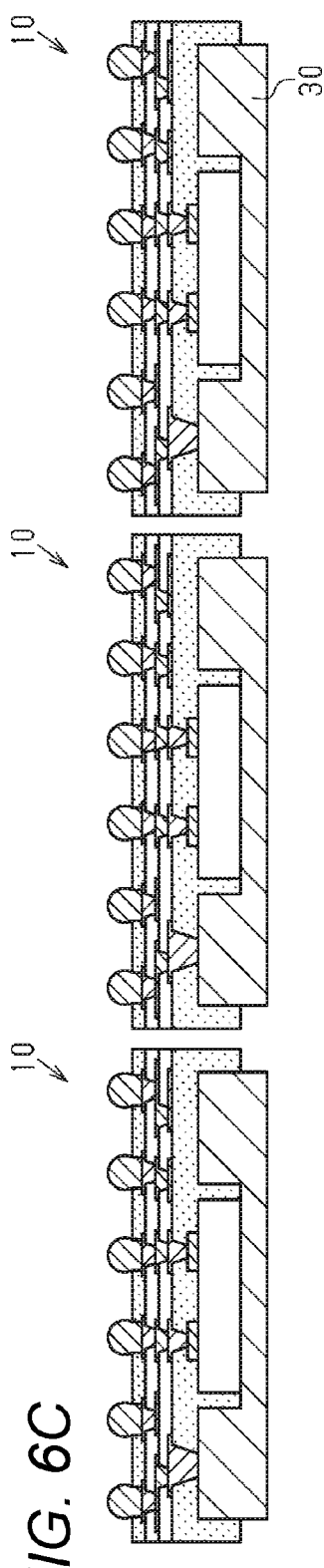

Next, a structure body shown in FIG. 6B is cut in a position indicated by a one-dot chain line by a dicing blade etc. Thus, an individually separated semiconductor package 10 can be obtained, as shown in FIG. 6C.

On this occasion, in the structure body shown in FIG. 6B, the heat radiator body 30 is not arranged in the cut position. Therefore, in a process of separating the semiconductor package 10 individually, occurrence of burrs (metal burrs in this case) in cut surfaces can be suppressed.

A heat sink 60 shown in FIG. 1 is connected to the semiconductor package 10 formed in the aforementioned manner. As shown in FIG. 1, an adhesive agent 70 is applied to an upper surface of the semiconductor package 10, i.e. the upper surface 32 of the heat radiator body 30. The heat sink 60 is pressed toward the semiconductor package 10. Thus, the heat sink 60 is connected to the upper surface of the semiconductor package 10 by the adhesive agent 70.

Next, effects of the aforementioned semiconductor device 1 will be described.

A lower portion of a side surface 35 of the heat radiator body 30 is covered with the covering portion 41 of the sealing resin 40. To describe in detail, the covering portion 41 covers the side surface 35 of the heat radiator body 30 up to at least the same height as the upper surface 22 of the semiconductor element 20.

The adhesive agent 70 is a thermal interface material (TIM) which is soft. In plan view, the external shape of the heat sink 60 is larger than the external shape of the upper surface 32 of the heat radiator body 30. In other words, in plan view, the heat sink 60 completely covers the heat radiator body 30. Therefore, the adhesive agent 70 may overflow from a space between the heat radiator body 30 and the heat sink 60. The overflowing adhesive agent 70 flows downward along the side surface 35 of the heat radiator body 30. Then, the adhesive agent 70 flows down to an upper surface 42 of the covering portion 41 of the sealing resin 40 in the side surface 35 of the heat radiator body 30. The sealing resin 40 is low in wettability to the adhesive agent 70. Therefore, the adhesive agent 70 which has flown down does not flow out to the upper surface 42 of the covering portion 41 of the sealing resin 40.

Heat of the semiconductor element 20 is transferred from the semiconductor element 20 to the heat sink through the heat radiator body 30. The heat generated by the semiconductor element 20 is dissipated from a center portion of the heat radiator body 30 toward an end portion of the heat radiator body 30, and transferred to the heat sink 60. A plate-like portion of the heat radiator body 30 functions as such a heat transfer path.

Assume that the entire side surface 35 of the heat radiator body 30 is not covered with the sealing resin 40. In this case, the adhesive agent 70 which has overflown from the space between the heat radiator body 30 and the heat sink 60 flows down to a lower end of the side surface 35 of the heat radiator body 30. A lower portion of the heat radiator body 30 has small contribution as the heat transfer path. Thus, the adhesive agent 70 is deposited on the side surface having small contribution to the heat transfer. Accordingly, heat transfer efficiency relative to a use amount of the adhesive agent 70 may be lowered.

To solve this problem, in the embodiment, by the covering portion 41, the adhesive agent 70 can be prevented from being deposited on the portion having small contribution in the side surface 35 of the heat radiator body 30. The adhesive agent 70 can be efficiently used as the heat transfer path so that heat transfer efficiency, i.e. heat radiation efficiency can be suppressed from being lowered.

The adhesive agent 70 stays at an upper side surface 35a of the portion (the plate-like portion of the heat radiator body 30) having large contribution as the transfer path. Thus, heat can be transferred also from the upper side surface 35a toward the heat sink 60. Therefore, the upper surface 32 and the upper side surface 35a of the heat radiator body 30 contribute to heat radiation more greatly, in comparison with the case where only the upper surface 32 of the heat radiator body 30 is bonded to the heat sink 60. Thus, heat radiation efficiency is more excellent.

The sealing resin 40 has the covering portion 41 which covers the side surface 35 of the heat radiator body 30 from below to reach at least substantially the same height as the upper surface 22 of the semiconductor element 20. That is, the sealing resin 40 is formed to cover a portion excluding the plate-like portion 30P of the heat radiator body 30, i.e. a lower surface, an outer side surface and an inner side surface of the rectangular ring-like portion 30R disposed around the semiconductor element 20, i.e. the lower surface 31, an inner side surface of a housing recess 33 and the side surface 35. Accordingly, a contact area between the heat radiator body 30 and the sealing resin 40 is larger than that in a heat radiator body having only a plate-like portion. Therefore, the heat radiator body 30 can be prevented from being stripped from the sealing resin 40 easily.

The heat radiator body 30 is connected to the solder bump 57 through the wiring layers 51, 53 and 55 of the wiring structure body 50 and the corresponding external connection terminal P1. Therefore, when the solder bump 57 connected to the heat radiator body 30 is connected to a wiring pattern (e.g. a ground wiring) of a predetermined potential in a board on which the semiconductor device 1 is mounted, the heat radiator body 30 functions as an electromagnetic shield. When the heat radiator body 30 is used as an electromagnetic shield in this manner, an electromagnetic influence on the semiconductor element 20 surrounded by the heat radiator body 30 can be reduced.

According to the embodiment, the semiconductor device 1 has the semiconductor package 10, the heat sink 60, and the adhesive agent 70 through which the heat sink 60 is connected on the semiconductor package 10. The semiconductor package 10 has the semiconductor element 20 as an object from which heat should be released, the heat radiator body 30, the sealing resin 40, and the wiring structure body 50.

The heat radiator body 30 is formed into a larger rectangular plate shape larger than that of the semiconductor element 20. The heat radiator body 30 has the housing recess 33 which is opened in a rectangular shape at the center of the lower surface 31 of the heat radiator body 30. The semiconductor element 20 is housed in the housing recess 33. The heat radiator body 30 is formed to contact the upper surface 22 of the semiconductor element 20 and cover the side surface 23 of the semiconductor element 20. The heat sink 60 is connected to the upper surface 32 of the heat radiator body 30 through the adhesive agent 70. The sealing resin 40 covers the lower surface 31 of the heat radiator body 30, the inner side surface of the housing recess 33, and the lower surface 21 and the side surface 23 of the semiconductor element 20. The sealing resin 40 has the covering portion 41 which contacts the side surface 35 of the heat radiator body 30 and covers the side surface 35 in a range of from the lower end of the side surface 35 to at least the same height as the upper surface 22 of the semiconductor element 20.

The adhesive agent 70 is a thermal interface material (TIM) which is soft. In plan view, the external shape of the heat sink 60 is larger than the external shape of the upper surface 32 of the heat radiator body 30. Therefore, the adhesive agent 70 may overflow from the space between the heat radiator body 30 and the heat sink 60. The overflowing adhesive agent 70 flows downward along the side surface 35 of the heat radiator body 30. The lower portion of the heat radiator body 30 has small contribution as the heat transfer path. In this manner, the adhesive agent 70 is deposited on the side surface having small contribution to the heat transfer. Accordingly, the heat transfer efficiency relative to the use amount of the adhesive agent 70 may be lowered. To solve this problem, in the embodiment, by the covering portion 41, the adhesive agent 70 can be prevented from being deposited on the portion having small contribution in the side surface 35 of the heat radiator body 30. Accordingly, the adhesive agent 70 can be efficiently used as the heat transfer path so that the heat transfer efficiency, i.e. the heat radiation efficiency can be suppressed from being lowered.

In addition, the adhesive agent 70 stays at the upper side surface 35a of the portion (the plate-like portion of the heat radiator body 30) having large contribution as the transfer path. Thus, heat can be transferred also from the upper side surface 35a toward the heat sink 60. Therefore, the upper surface 32 and the upper side surface 35a of the heat radiator body 30 contribute to heat radiation more greatly, in comparison with the case where only the upper surface 32 of the heat radiator body 30 is bonded to the heat sink 60. Thus, the heat radiation efficiency can be improved.

Further, the sealing resin 40 has the covering portion 41 which covers the side surface 35 of the heat radiator body 30 from below to reach at least substantially the same height as the upper surface 22 of the semiconductor element 20. That is, the sealing resin 40 is formed to cover a portion excluding the plate-like portion 30P of the heat radiator body 30, i.e. the lower surface, the outer side surface and the inner side surface of the rectangular ring-like portion 30R arranged around the semiconductor element 20, i.e. the lower surface 31, the inner side surface of the housing recess 33 and the side surface 35. Accordingly, the contact area between the heat radiator body 30 and the sealing resin 40 is larger than that in the heat radiator body having only the plate-like portion. Therefore, the heat radiator body 30 can be prevented from being removed from the sealing resin 40 easily. The likelihood of the removal of the heat radiator 30 can be reduced.

<Modifications>

Next, modifications as to the aforementioned embodiment will be described.

Incidentally, in each of the following modifications, the same members as those in the aforementioned embodiment will be referred to by the same signs correspondingly and respectively, and description thereof will be omitted partially or entirely.

<Modification 1>

Figure 7:
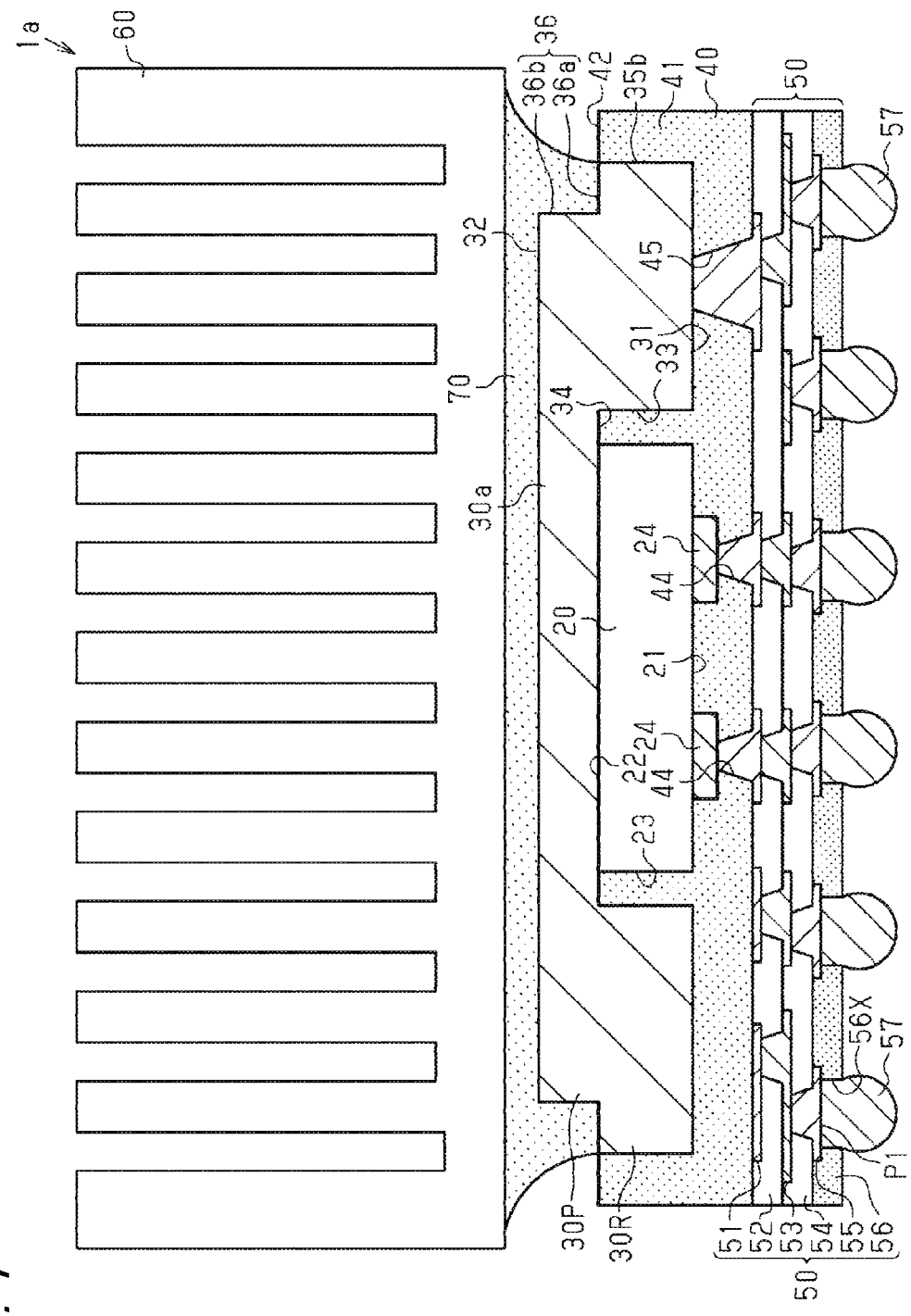
FIG. 7 is a schematic sectional view showing a semiconductor device according to Modification 1.

As shown in FIG. 7, a semiconductor device 1a has a semiconductor package 10a, a heat sink 60, and an adhesive agent 70 through which the heat sink 60 is connected onto the semiconductor package 10a.

The semiconductor package 10a has a semiconductor element 20 as an object from which heat should be released, a heat radiator body 30a, a sealing resin 40, and a wiring structure body 50. The heat radiator body 30a is formed into a larger rectangular plate shape than that of the semiconductor element 20. The heat radiator body 30a has a housing recess 33 opened in a rectangular shape at the center of a lower surface 31 of the heat radiator body 30. The housing recess 33 is opened upward from the lower surface 31 in the heat radiator body 30a. The semiconductor element 20 is housed in the housing recess 33.

According to the modification 1, the heat radiator body 30a has a step 36 in which an upper end of an outer circumferential portion of the heat radiator body 30a has been notched into a rectangular shape in section. In the step 36, there is a difference in height between an upper surface of a center portion and an upper surface of an end portion. In the modification 1, a bottom surface 36a of the step 36 is formed on the same plane as an upper surface 42 of a covering portion 41 of the sealing resin 40. In addition, a side surface 36b of the step 36 is positioned on an inner side of the heat radiator body 30a than a lower side surface 35b which the covering portion 41 of the sealing resin 40 contacts. The side surface 36b is not covered with the covering portion 41. Incidentally, the bottom surface 36a of the step 36 is also not covered with the covering portion 41.

In a similar manner to the aforementioned embodiment, the adhesive agent 70 overflowing from a space between the heat sink 60 and the heat radiator body 30a when the heat sink 60 is bonded flows downward along the side surface 36b of the step 36 to contact the bottom surface 36a of the step 36. Thus, the adhesive agent 70 is bonded to the side surface 36b and the bottom surface 36a of the step 36. Thus, the side surface 36b and the bottom surface 36a of the step 36 functions as an upper side surface of the heat radiator body 30a to which the adhesive agent 70 is bonded. An end portion of the adhesive agent 70 is connected to the heat radiator 30a. Therefore, the end portion of the adhesive agent 70 can be prevented from being separated from the heat radiator body 30a easily. That is, tight contact properties of the adhesive agent 70 with the heat radiator body 30a can be improved.

A method for manufacturing each semiconductor device 1a (semiconductor package 10a) will be described.

A structure body 110 shown in FIG. 8A is formed by steps shown in FIGS. 2A to 4B in the aforementioned embodiment. The structure body 110 has the sealing resin 40, the semiconductor element 20 embedded in the sealing resin 40, and a plating layer 105 connected to an upper surface 22 of the semiconductor element 20.

In the structure body 110, a resist film 111 having an opening portion 111X is formed on an upper surface of the plating layer 105. The opening portion 111X is formed in accordance with the covering portion 41 of the sealing resin 40 so as to be offset to the semiconductor element 20 side relatively to the covering portion 41. For example, the opening portion 111X is formed into a latticed shape having a size (pitch) corresponding to the semiconductor package 10 shown in FIG. 1 in plan view.

As the material of the resist film 111, for example, a material etching-resistant to etching treatment in a next step can be used. For example, as the material of the resist film 111, a photosensitive dry film resist or a liquid photoresist (e.g. a dry film resist or a liquid photoresist made of a novolac-based resin or an acrylic-based resin etc.) etc. can be used. For example, the dry film resist is patterned by a photolithographing method so that the resist film 111 having the aforementioned opening portion 111X can be formed.

As shown in FIG. 8B, the plating layer 105 is etched, for example, by dry etching using the resist film 111 as an etching mask, so that the sealing resin 40 can be exposed from the opening portion 111X. In this step, the opening portion 111X is offset to the semiconductor element 20 side relatively to the covering portion 41 of the sealing resin 40. Therefore, the step 36 is formed at an upper end of an outer circumferential portion of the heat radiator body 30a which has been etched into a rectangular shape in section. Incidentally, the plating layer 105 may be etched by wet etching. By the etching treatment, the plating layer 105 is formed into the separated heat radiator body 30a.

Then, in a similar manner to the aforementioned embodiment, the wiring structure body 50 shown in FIG. 7 is formed. The heat sink 60 is connected to an upper surface 32 of the heat radiator body 30a through the adhesive agent 70.

Incidentally, in the semiconductor device 1a shown in FIG. 7, the position of the bottom surface 36a of the step 36 may be located on a lower side (wiring structure body 50 side) than the upper surface 42 of the covering portion 41 of the sealing resin 40. In this case, the upper surface 42 of the covering portion 41 becomes higher than the bottom surface 36a of the step 36. Therefore, a contact area between the heat radiator body 30*a* and the adhesive agent 70 is larger than that in the aforementioned modification 1. In addition, the adhesive agent 70 flowing downward along the side surface 36*b* of the step 36 in the heat radiator body 30*a* stays at the covering portion 41 so that the adhesive agent 70 can be prevented from flowing out to the sealing resin 40.

<Modification 2>

Figure 9:
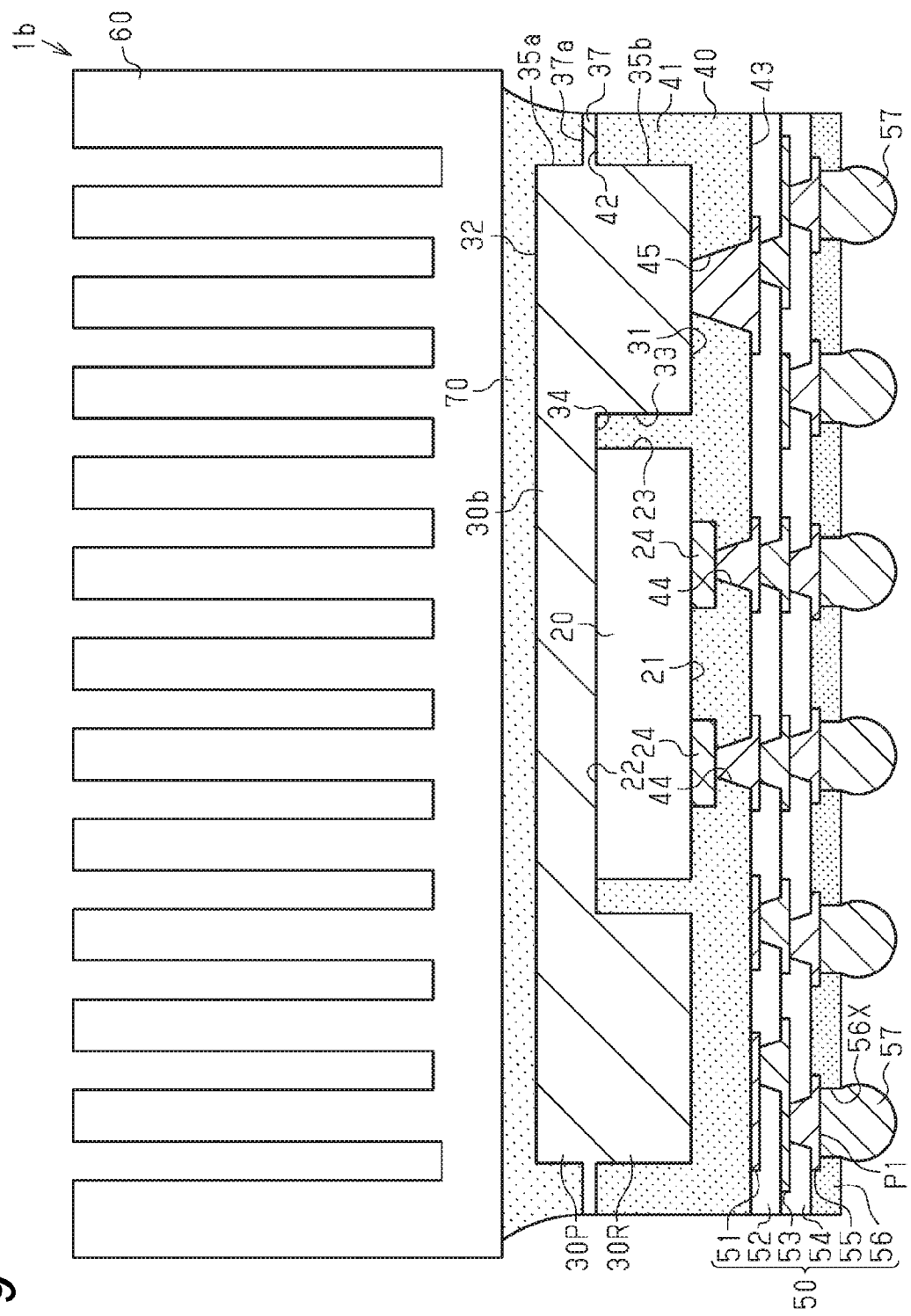
FIG. 9 is a schematic sectional view showing a semiconductor device according to Modification 2.

As shown in FIG. 9, a semiconductor device 1*b* has a semiconductor package 10*b*, a heat sink 60, and an adhesive agent 70 through which the heat sink 60 is connected onto the semiconductor package 10*b*.

The semiconductor package 10*b* has a semiconductor element 20 as an object from which heat should be released, a heat radiator body 30*b*, a sealing resin 40, and a wiring structure body 50. The heat radiator body 30*b* is formed into a larger rectangular plate shape than that of the semiconductor element 20. The heat radiator body 30*b* has a housing recess 33 which is opened in a rectangular shape at the center of a lower surface 31 of the heat radiator body 30*b*. The housing recess 33 is opened upward from the lower surface 31 in the heat radiator body 30*b*. The semiconductor element 20 is housed in the housing recess 33.

In the modification 2, the heat radiator body 30*b* has a thin plate ring-like protrusion 37 which extends outward from an upper side surface 35*a*. The protrusion 37 is formed to cover an upper surface 42 of a covering portion 41 of the sealing resin 40 and contact the upper surface 42. An upper surface 37*a* of the protrusion 37 is positioned to be lower in height than an upper surface 32 of a center portion of the heat radiator body 30*b* so that a step can be formed. Accordingly, the upper side surface 35*a* ranging from an upper end of the heat radiator body 30*b* to the protrusion 37 is not covered with the covering portion 41 of the sealing resin 40.

In a similar manner to the aforementioned embodiment and the aforementioned modification 1, the adhesive agent 70 overflowing from a space between the heat sink 60 and the heat radiator body 30*b* when the heat sink 60 is bonded flows downward along the upper side surface 35*a* and contact the upper surface 37*a* of the protrusion 37. That is, an end portion of the adhesive agent 70 is connected to the upper surface 37*a* of the protrusion 37 of the heat radiator body 30*b*. Thus, the adhesive agent 70 is bonded to the upper side surface 35*a* and the upper surface 37*a* of the protrusion 37. Thus, the upper side surface 35*a* and the upper surface 37*a* function as an upper side surface to which the adhesive agent 70 is bonded. Therefore, the end portion of the adhesive agent 70 can be prevented from being separated from the heat radiator body 30*b* easily, that is, tight contact properties of the adhesive agent 70 with the heat radiator body 30*b* can be improved.

When such a protrusion 37 is provided, a contact area between the heat radiator body 30*b* and the adhesive agent 70 can be made larger, for example, than that in the aforementioned embodiment. In addition, heat of the heat radiator body 30*b* is transferred also from the protrusion 37 to the heat sink 60 through the adhesive agent 70. Accordingly, a thermal contact area between the heat radiator body 30*b* and the heat sink 60 can be larger than that in the aforementioned embodiment or the aforementioned Modification 1 so that heat can be radiated efficiently.

A method for manufacturing each semiconductor device 1*b* (semiconductor package 10*b*) will be described.

A structure body 110 shown in FIG. 10A is formed by steps shown in FIGS. 2A to 4B in the aforementioned embodiment. The structure body 110 has the sealing resin 40, the semiconductor element 20 which is embedded in the sealing resin 40, and a plating layer 105 which is connected to an upper surface 22 of the semiconductor element 20.

In the structure body 110, a resist film 106 having an opening portion 106X is formed on an upper surface of the plating layer 105. The opening portion 106X is formed in accordance with the covering portion 41 of the sealing resin 40. For example, the opening portion 106X is formed into a latticed shape having a size (pitch) corresponding to the semiconductor package 10 shown in FIG. 1 in plan view.

As the material of the resist film 106, for example, a material etching-resistant to etching treatment in a next step can be used. For example, as the material of the resist film 106, a photosensitive dry film resist or a liquid photoresist (e.g. a dry film resist or a liquid photoresist made of a novolac-based resin or an acrylic-based resin etc.) etc. can be used. For example, the dry film resist is patterned by a photolithographing method so that the resist film 106 having the aforementioned opening portion 106X can be formed.

As shown in FIG. 10B, the plating layer 105 is etched, for example, by dry etching, using the resist film 106 as an etching mask. A time of the etching treatment is adjusted relatively to the aforementioned embodiment (to be shorter) so that the protrusion 37 can be left on the sealing resin 40. In this step, incidentally, the plating layer 105 may be etched by wet etching.

Then, in a similar manner to the aforementioned embodiment, the wiring structure body 50 shown in FIG. 9 is formed. The heat sink 60 is connected to the upper surface 32 of the heat radiator body 30*b* through the adhesive agent 70.

<Modification 3>

Figure 11:
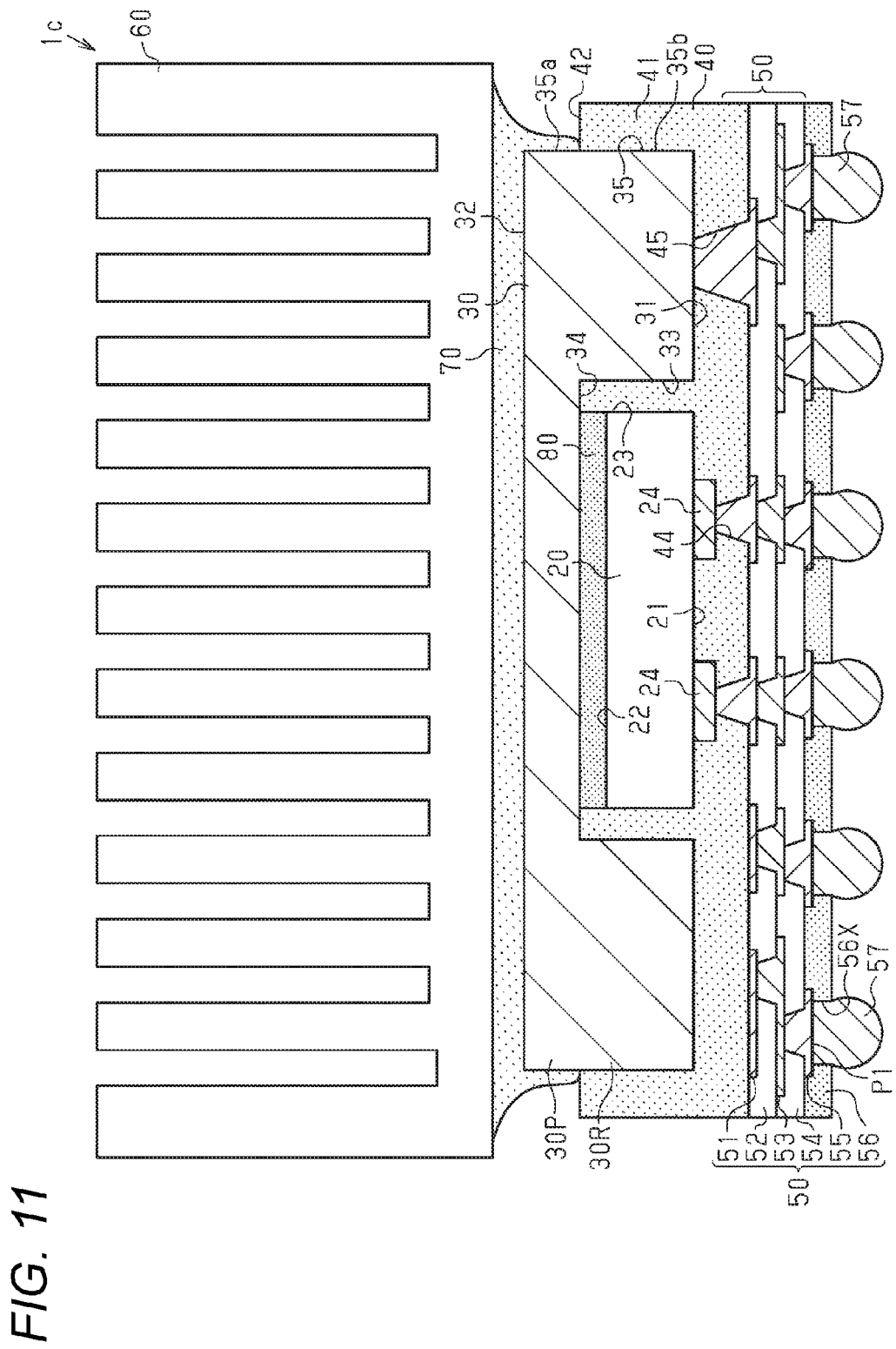
FIG. 11 is a schematic sectional view showing a semiconductor device according to Modification 3.

As shown in FIG. 11, a semiconductor device 1*c* has a semiconductor package 10*c*, a heat sink 60, and an adhesive agent 70 through which the heat sink 60 is connected onto the semiconductor package 10*c*.

The semiconductor package 10*c* has a semiconductor element 20 as an object from which heat should be released, a heat radiator body 30, a sealing resin 40, a wiring structure body 50, and a connection member 80.

The heat radiator body 30 is formed into a larger rectangular plate shape than that of the semiconductor element 20. The heat radiator body 30 has a housing recess 33 which is opened in a rectangular shape at the center of a lower surface 31 of the heat radiator body 30. The housing recess 33 is opened upward from the lower surface 31 in the heat radiator body 30. The semiconductor element 20 is housed in the housing recess 33. An upper surface 22 of the semiconductor element 20 is thermally connected to a bottom surface 34 of the housing recess 33 through the connection member 80. The connection member 80 has thermal conductivity. For example, the connection member 80 is made of a thermal interface material (TIM). For example, the connection member 80 is used for arranging the semiconductor element 20 on a support body 101 (see FIG. 2A).

In the semiconductor device 1*c*, the semiconductor element 20 and the heat radiator body 30 are thermally connected to each other through the connection member 80. Thus, heat of the semiconductor element 20 can be transferred to the heat radiator body 30 through the adhesive agent. Due to the connection member 80 which is used for arranging the semiconductor element 20 on the support body 101 (see FIG. 2A), a step shown in FIG. 3D in the aforementioned embodiment can be omitted. Therefore, the number of steps for manufacturing the semiconductor package 10*c* can be smaller than that in the aforementioned embodiment. Thus, the manufacturing time can be shortened.

Incidentally, the aforementioned embodiment and the modifications may be carried out in the following modes.

In the aforementioned embodiment, the wiring structure body 50 is formed after the heat radiator body 30 is formed. However, the heat radiator body 30 may be formed after the wiring structure body 50 is formed. In each of the modifications, the heat radiator body 30 may be also formed after the wiring structure body 50 is formed.

In the aforementioned Modification 2, the position of the side surface upper than the protrusion 37 may be offset to the outer side or the center side relatively to the position of the side surface of the portion covered with the sealing resin 40. That is, the size of the upper surface of the heat radiator body 30 may be changed suitably.

In the aforementioned embodiment and the modifications, the configuration of the wiring structure body 50 is merely an example. The number of wiring layers and the number of insulating layers may be changed suitably.

In addition, in the aforementioned embodiment, the electrode terminals 24 of the semiconductor element 20 may be exposed when the sealing resin 40 is thinned. In this case, the front surface of the sealing resin 40 is flush with the front surfaces of the electrode terminals 24 of the semiconductor element 20.

Further, any of various cooling and heat radiating units such as a heat pipe and a vapor chamber may be provided as the heat sink 60 in each of the aforementioned embodiment and the aforementioned modifications.

As described above, the exemplary embodiment and the modification are described in detail. However, the present invention is not limited to the above-described embodiment and the modification, and various modifications and replacements are applied to the above-described embodiment and the modifications without departing from the scope of claims.

Various aspects of the subject matter described herein are set out non-exhaustively in the following numbered clauses:

1) A method of manufacturing a semiconductor device, comprising:
  a) disposing a semiconductor element on a support body, wherein the semiconductor element has: a first surface on which an electrode terminal is formed; and a second surface opposite side to the first surface and which is opposed to the support body;
  b) forming a sealing resin to cover the first surface of the semiconductor element, wherein the sealing resin has: a first surface; and a second surface opposite to the first surface and which contacts the support body;
  c) removing the support body;
  d) forming a recessed portion in the second surface of the sealing resin to surround the semiconductor element;
  e) forming a plating layer by a plating method to fill the recessed portion with the plating layer and cover the semiconductor element with the plating layer;
  f) etching the plating layer to form a heat radiator body; and
  g) forming a wiring structure body on the first surface of the sealing resin, wherein the wiring structure body comprises an insulating layer and a wiring layer.

2) The method of clause (1), wherein
  the step f) comprises:
    forming a resist layer on an upper surface of the plating layer, wherein the resist layer has an opening portion through which the plating layer is exposed; and
    etching the plating layer using the resist layer as a mask.

3) The method of clause (2), wherein
  an end portion of the opening portion of the resist layer overlaps with an outer side end portion of the recessed portion in plan view; and
  in the step f), the plating layer is etched to expose the sealing resin.

4) The method of clause (2), wherein
  an end portion of the opening portion of the resist layer is located between an outer side end portion of the recessed portion and the semiconductor element in plan view, and
  in the step f), the plating layer is etched to expose the sealing resin so as to form the heat radiator body having a step.

5) The method of clause (2), wherein
  an end portion of the opening portion of the resist layer overlaps with an outer side end portion of the recessed portion in plan view, and
  in the step f), the plating layer is partially etched so as to form the heat radiator body having a protrusion covering the second surface of the sealing resin.

6) The method of clause (1), further comprising:
  h) connecting a heat sink to an upper surface of the heat radiator body through an adhesive agent having a thermal conductivity,
  wherein in the step h), the adhesive agent contacts a side surface of the heat radiator body.

What is claimed is:
1. A semiconductor device comprising:
  a semiconductor element having a semiconductor element upper surface, a semiconductor element lower surface opposite to the semiconductor element upper surface and on which an electrode terminal is formed, and a semiconductor element side surface between semiconductor element upper surface and the semiconductor element lower surface;
  a heat radiator body having a heat radiator body upper surface, a heat radiator body lower surface opposite to the heat radiator body upper surface, a heat radiator body outer side surface between the heat radiator body upper surface and the heat radiator body lower surface, and a housing recess which is formed in the heat radiator body lower surface and houses the semiconductor element, wherein a bottom surface of the housing recess is thermally connected to the semiconductor element upper surface;
  a heat sink which is thermally connected to the heat radiator body upper surface through adhesive agent having thermal conductivity;
  a sealing resin which covers the heat radiator body lower surface and the heat radiator body outer side surface, an inner side surface of the housing recess, and the semiconductor element lower surface and the semiconductor element side surface; and
  a wiring structure body which is formed on a sealing resin lower surface of the sealing resin to be electrically connected to the semiconductor element,
  wherein
  the sealing resin comprises
  a covering portion formed in a frame shape along the heat radiator body outer side surface, the covering portion having a covering portion upper surface which is substantially flush with the bottom surface of the housing recess and covering the heat radiator body outer side surface, and
  the adhesive agent contacts the heat radiator body outer side surface.

2. The semiconductor device of claim 1, wherein
the heat radiator body outer side surface has a step, and
the adhesive agent contacts a bottom surface and a side surface of the step.

3. The semiconductor device of claim 1, wherein
the heat radiator body outer side surface has a protrusion which extends outward from the heat radiator body outer side surface to cover the covering portion upper surface, and
the adhesive agent contacts an upper surface of the protrusion.

4. The semiconductor device of claim 1, further comprising:
a thermally conductive connection member which is disposed between the semiconductor element upper surface and the bottom surface of the housing recess to thermally connect the semiconductor element and the heat radiator body.

5. A semiconductor package comprising:
a semiconductor element having a semiconductor element upper surface, a semiconductor element lower surface opposite to the upper surface and on which an electrode terminal is formed, and a semiconductor element side surface between the semiconductor element upper surface and the semiconductor element lower surface;
a heat radiator body having a heat radiator body upper surface, a heat radiator body lower surface opposite to the heat radiator body upper surface, a heat radiator body outer side surface between the heat radiator body upper surface and the heat radiator body lower surface, and a housing recess which is formed in the heat radiator body lower surface and houses the semiconductor element, wherein a bottom surface of the housing recess is thermally connected to the semiconductor element upper surface;
a sealing resin which covers the heat radiator body lower surface and the heat radiator body outer side surface, an inner side surface of the housing recess, and the semiconductor element lower surface and the semiconductor element side surface; and
a wiring structure body which is formed on a sealing resin lower surface of the sealing resin to be electrically connected to the semiconductor element,
wherein
the sealing resin comprises:
a covering portion formed in a frame shape along the heat radiator body outer side surface, the covering portion having a covering portion upper surface which is substantially flush with the bottom surface of the housing recess and covering the heat radiator body outer side surface.

* * * * *